US006932696B2

(12) United States Patent
Schwartz et al.

(10) Patent No.: US 6,932,696 B2
(45) Date of Patent: Aug. 23, 2005

(54) COOLING SYSTEM INCLUDING REDUNDANT FAN CONTROLLERS

(75) Inventors: William H. Schwartz, San Diego, CA (US); Anthony N. Eberhardt, Menlo Park, CA (US); Cathleen A. Quick, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 93 days.

(21) Appl. No.: 10/338,598

(22) Filed: Jan. 8, 2003

(65) Prior Publication Data

US 2004/0130868 A1 Jul. 8, 2004

(51) Int. Cl.[7] .............................................. H05K 7/20
(52) U.S. Cl. ..................... 454/184; 361/695; 417/44.11
(58) Field of Search ......................... 454/184; 361/695; 236/49.3; 417/44.11, 22

(56) References Cited

U.S. PATENT DOCUMENTS

| | | | | |
|---|---|---|---|---|
| 5,727,928 A | * | 3/1998 | Brown | 417/44.11 |
| 5,751,549 A | * | 5/1998 | Eberhardt et al. | 361/687 |
| 5,787,971 A | | 8/1998 | Dodson | |
| 5,831,525 A | * | 11/1998 | Harvey | 340/507 |
| 5,848,230 A | * | 12/1998 | Walker | 714/7 |
| 5,966,510 A | | 10/1999 | Carbonneau et al. | |
| 6,000,623 A | * | 12/1999 | Blatti et al. | 236/49.3 |
| 6,101,459 A | | 8/2000 | Tavallaei et al. | |
| 6,368,064 B1 | | 4/2002 | Bendikas et al. | |
| 6,639,794 B2 | * | 10/2003 | Olarig et al. | 361/687 |
| 6,702,665 B1 | * | 3/2004 | Tai | 454/256 |
| 6,709,111 B2 | | 3/2004 | Hirao et al. | |
| 6,725,132 B2 | * | 4/2004 | Frankel et al. | 700/300 |
| 2003/0227757 A1 | * | 12/2003 | Vincent et al. | 361/796 |
| 2004/0009074 A1 | * | 1/2004 | Dodson, III | 417/22 |

FOREIGN PATENT DOCUMENTS

| | | | | | |
|---|---|---|---|---|---|
| EP | | 817555 A2 | * | 1/1998 | H05K/7/20 |
| JP | | 11024794 A | * | 1/1999 | G06F/1/20 |

OTHER PUBLICATIONS

"Sun Introduces World's Best Solution for Attacking Cost of Ownership in Corporate Data Centers", Sun Microsystems, Inc., Press Release, Sep. 25, 2001, New York, NY.

* cited by examiner

Primary Examiner—Harold Joyce
(74) Attorney, Agent, or Firm—Meyertons Hood Kivlin Kowert & Goetzel, P.C.; B. Noël Kivlin

(57) ABSTRACT

A cooling system including redundant fan controllers. The cooling system includes a first fan controller coupled to control a first plurality of fans and a second fan controller coupled to control a second plurality of fans. During operation, the first plurality of fans and the second plurality of fans operate concurrently. The first fan controller and the second fan controller are each configured to monitor the first and the second plurality of fans and to detect a failure in any of the first and the second plurality of fans. Further, in response to detecting a failure of a fan of the first plurality of fans, the second fan controller is configured to increase an operating speed of a corresponding fan of the second plurality of fans.

27 Claims, 4 Drawing Sheets

COOLING SYSTEM INCLUDING REDUNDANT FAN CONTROLLERS

BACKGROUND OF THE INVENTION

1. Field of the Invention

This invention relates to computer system cooling and, more particularly, to fan cooling systems having redundant fan controllers and redundant fans.

2. Description of the Related Art

Computer systems are typically available in a range of configurations which may afford a user varying degrees of reliability, availability and serviceability (RAS). In some systems, reliability may be paramount. Thus, a reliable system may include features designed to prevent failures. In other systems, availability may be important and so systems may be designed to have significant fail-over capabilities in the event of a failure. Either of these types of systems may include built-in redundancies of critical components. In addition, systems may be designed with serviceability in mind. Such systems may allow fast system recovery during system failures due to component accessibility. In critical systems, such as high-end servers and some multiple processor and distributed processing systems, a combination of the above features may produce the desired RAS level.

Many systems provide redundant backup components. In a typical redundant cooling fan system, a redundant backup fan may be powered off and if the primary fan fails, the backup fan may be powered up to take over the cooling load. However in these types of systems, a primary fan controller and or a system controller must assume that the backup fan and associated control circuitry will be operational when needed.

SUMMARY OF THE INVENTION

Various embodiments of a cooling system including redundant fan controllers are disclosed. In one embodiment, the cooling system includes a first fan controller coupled to control a first plurality of fans and a second fan controller coupled to control a second plurality of fans. During operation, the first plurality of fans and the second plurality of fans operate concurrently. The first fan controller and the second fan controller are each configured to monitor the first and the second plurality of fans and to detect a failure in any of the first and the second plurality of fans. Further, in response to detecting a failure of a fan of the first plurality of fans, the second fan controller is configured to increase an operating speed of a corresponding fan of the second plurality of fans.

Figure 1:
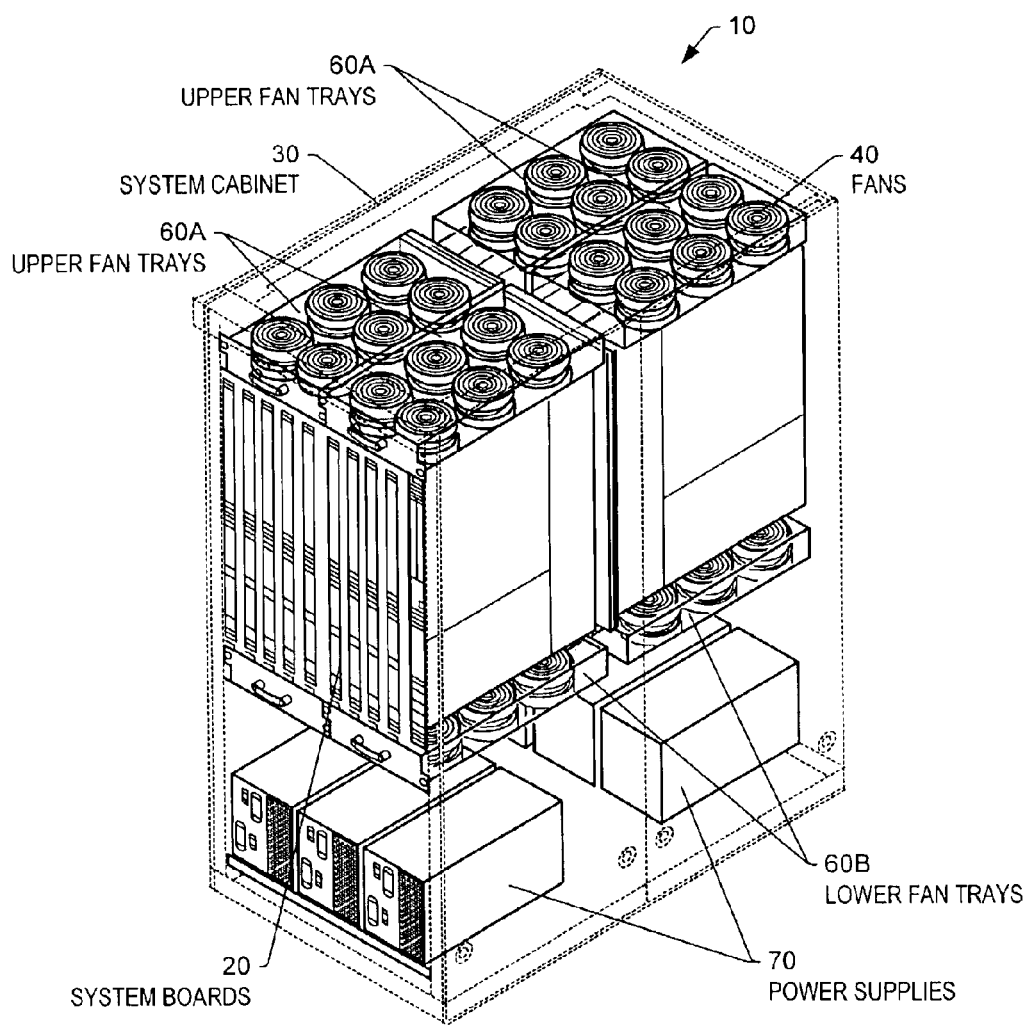
FIG. 1 is a perspective view illustration of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 2:
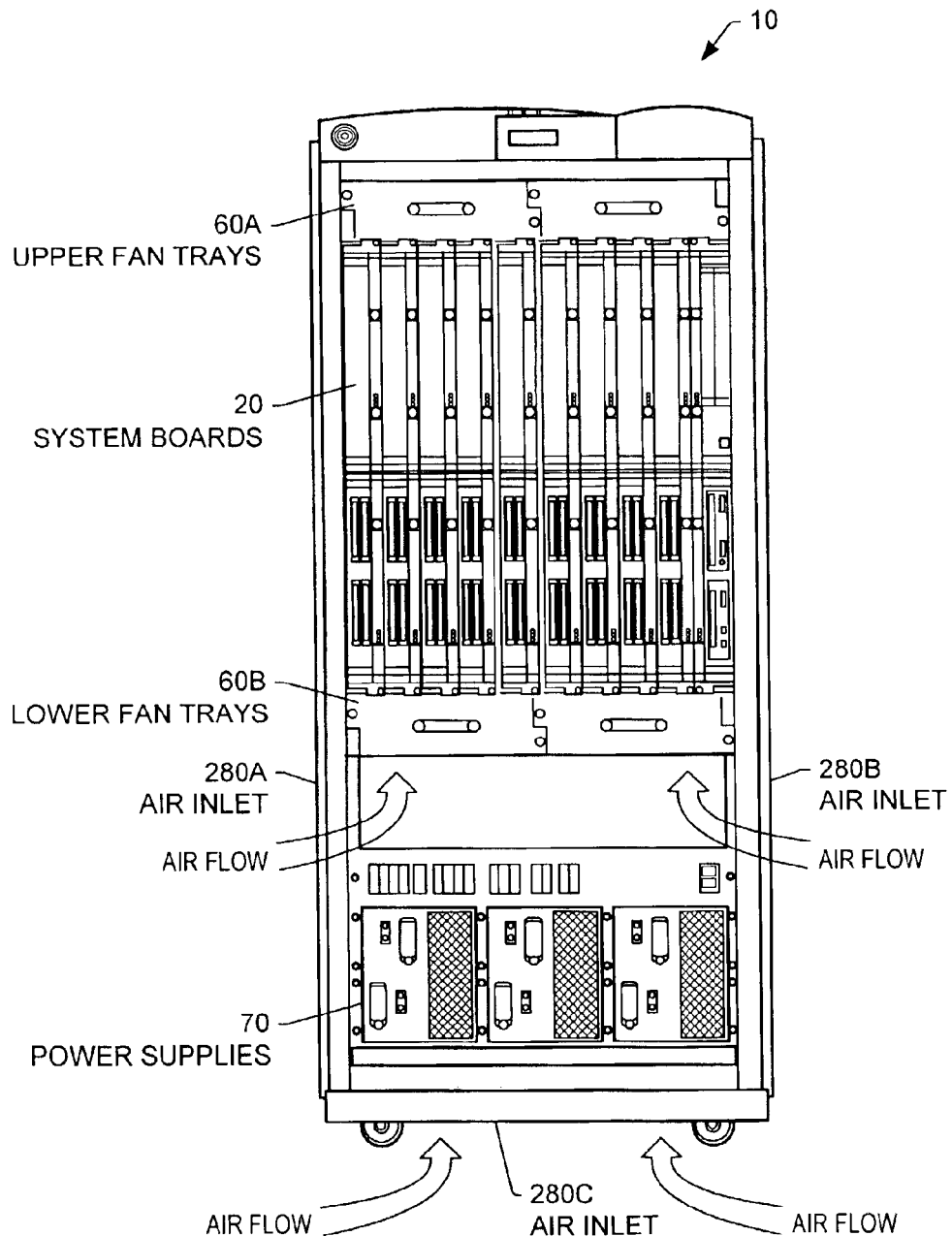
FIG. 2 is a front view illustration of one embodiment of the computer system of FIG. 1.

The illustrations shown in FIG. 1 and FIG. 2 depict one embodiment of a computer system including a fan cooling system. The fan cooling system includes several fan trays each having two layers of fans. The fans in each layer may be independently controlled by a respective fan controller.

Turning now to FIG. 1, a perspective view illustration of one embodiment of a computer system is shown. Computer system 10 includes a plurality of system boards 20 housed by a system cabinet 30. System cabinet 30 may include removable panels as well as a frame structure (not shown) for holding system boards 20 and other components. System boards 20 may include processor boards, input/output (I/O) boards, memory boards and system controller boards. Computer system 10 also includes various power supplies 70, a set of upper fan trays 60A and a set of lower fan trays 60B.

In the illustrated embodiment, there are four fan trays 60A above and four fan trays 60B below system boards 20. Each fan tray may include 12 fans. The twelve fans may be arranged in two layers of six fans each. The two layers are physically placed on top of each other such that each fan in a given layer is paired with a corresponding fan of the second layer. It is noted that although each set of fan trays 60A–B includes four fan trays as shown. It is noted that in alternative embodiments, other numbers of fan trays may be used and each fan tray may include other numbers of fans.

As will described in greater detail below in conjunction with the descriptions of FIG. 2–FIG. 4, during operation, the air flows through both fans of a fan pair. The fans may have three speeds and may normally run at low speed. If the temperature of any sensed components in the system rises, all fans may be set to a high speed. Both fans of a fan pair may be running at the same time. If a single fan fails, the redundant fan in the corresponding layer of a given fan tray switches to super high-speed. This fan arrangement may provide N+1 fan redundancy, thereby allowing the system to continue to run with a failed fan or fans. In addition, if a fan controller fails, the remaining fan controller may continue to operate with its fans set to super high-speed.

Referring to FIG. 2, a front view illustration of the computer system of FIG. 1 is shown. Components corresponding to those shown in FIG. 1 are numbered identically for simplicity and clarity. FIG. 2 further illustrates the fan tray arrangement and the airflow through computer system 10. In the illustrated embodiment, lower fan trays 60B pull cool air in through air inlets 280A and 280B in the sides of system cabinet 30 and also up through air inlet 280C in the bottom of system cabinet 30 and through power supplies 70. Further, lower fan trays 60B may force air up and through system boards 20. Upper fan trays 60A may pull the air through system boards 20 and exhaust the warmed air out through the top of system cabinet 30.

Figure 3:
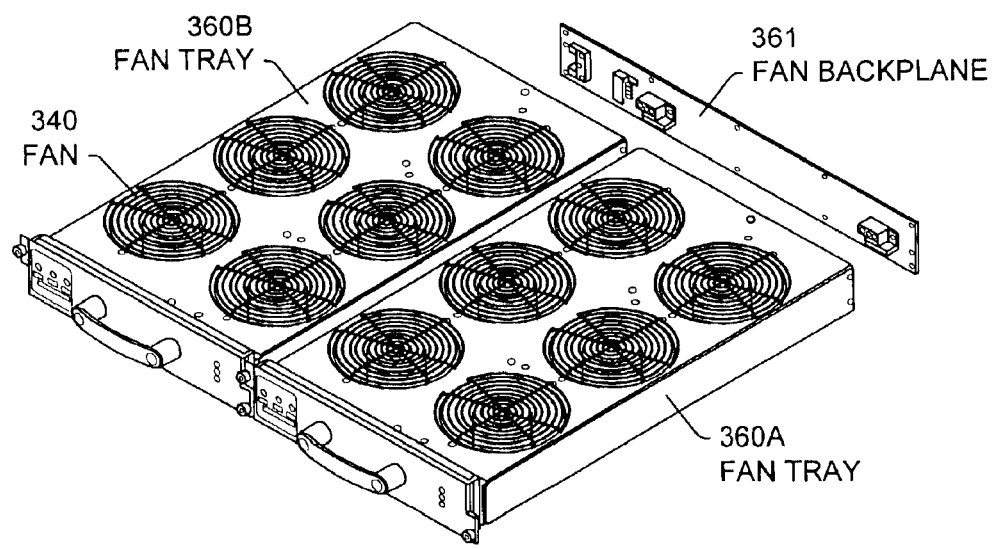
FIG. 3 is a perspective view illustration of one embodiment of a fan tray.

Turning to FIG. 3, a perspective view of one embodiment of a fan tray arrangement of a computer system is shown. As described above, each of fan trays 360A and 360B may include twelve fans arranged in two layers each having six fans. Fan trays 360A and 360B maybe coupled to computer system 10 via fan backplane 361. In one embodiment, fan backplane 361 is an interface to computer system 10 and may provide a feed-through for power and control signals to fan trays 360A–B. It is noted that in alternative embodiments, fan backplane 361 may be implemented as two independent backplane units. Each of fan trays 360A–B may be installed and removed from computer system 10 as a unit by sliding the tray in and out of system cabinet 30. In one embodiment, each of the fan trays may be hot-swapped while the system is running. As used herein, the term "hot-swapping" refers to removing and replacing a component while the system continues to operate. It is noted that in one embodiment, fan trays 360A–B may be installed in a computer system such as the computer system of FIG. 2 and FIG. 3.

Figure 4:
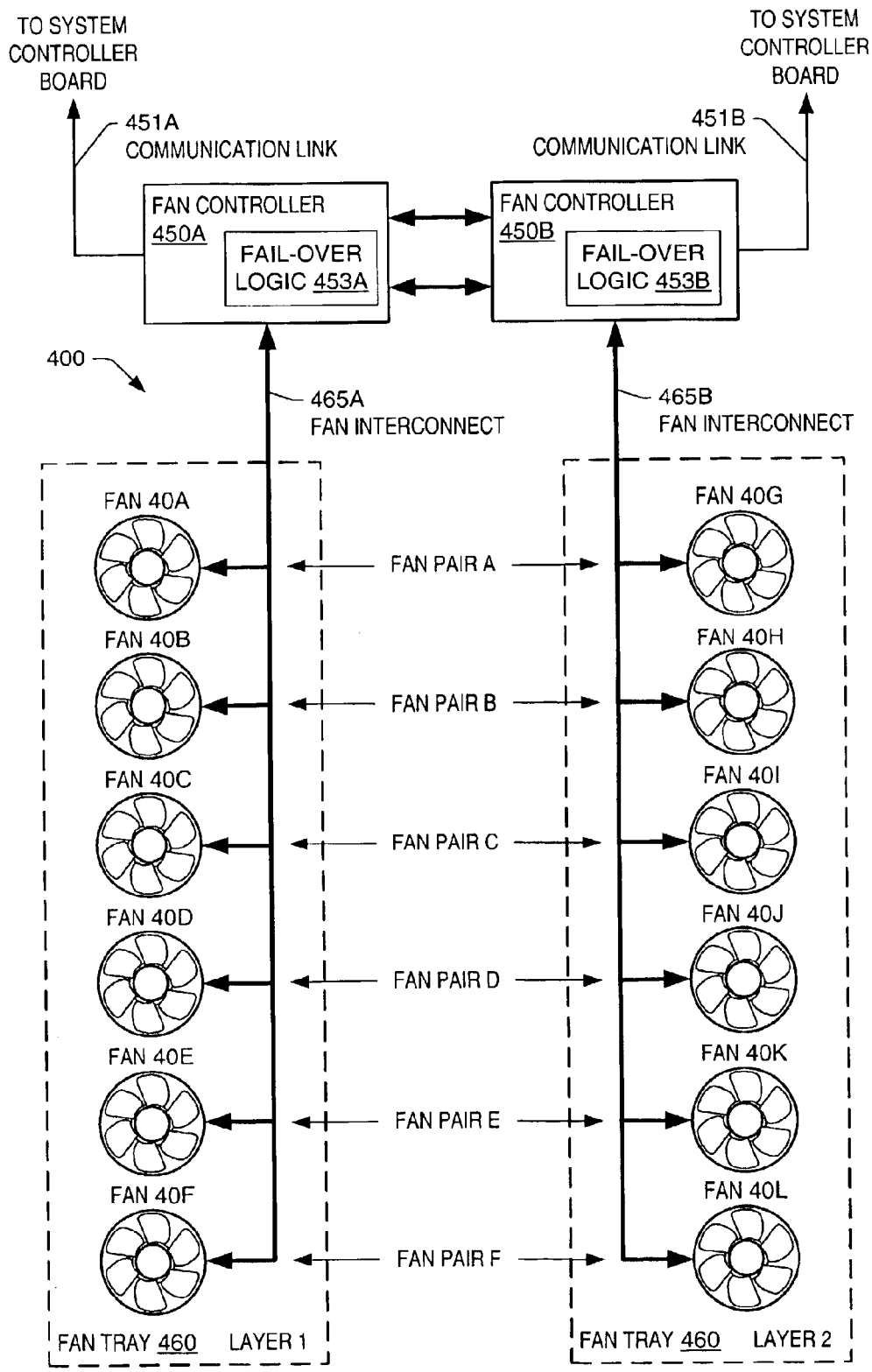
FIG. 4 is a block diagram of one embodiment of a fan cooling system.

Referring to FIG. 4, a block diagram of one embodiment of a fan cooling system is shown. Fan cooling system 400 is an exemplary fan cooling system such as the fan cooling system shown in computer system 10 of FIG. 1 and FIG. 2, for example. Fan cooling system 400 includes a fan controller 450A coupled to six fans designated 440A through 440F. Fan controller 450A is coupled to control fans 450A–F via a fan interconnect 465A. Fan cooling system 400 also includes a fan controller 450B coupled to six fans designated 440G through 440L via a fan interconnect 465B. In one embodiment, fan interconnect 465A–B may be implemented using cables and connectors. In alternative embodiments, fan interconnect 465A–B may be implemented using circuit boards, connectors and cables. It is noted that although each of fan controllers 450A–B is connected to and controls six fans, other embodiments are contemplated in which other numbers of fans may be coupled to and controlled by each of fan controllers 450A–B. Fan controller 450A and fan controller 450B may be coupled to one or more system controller boards (not shown) via a communication link 451A and 451B, respectively. In one embodiment, communication links 451A and 451B may each be an I2C link, for example. In one embodiment, fan controllers 450A–B may be mounted within fan tray 460 such as the fan trays illustrated in FIG. 1–FIG. 3, for example.

In the illustrated embodiment, fans 440A–L are included in a fan tray 460 such as the fan trays illustrated in FIG. 1–FIG. 3, for example. However, it is contemplated that the fan trays may be any suitable enclosure for housing fans. Fans 440A–440F are shown as layer 1 of fan tray 460, while fans 440G–440L are shown as layer 2 of fan tray 460. As shown in FIG. 1, one of the fan layers is physically placed on top of the other fan layer creating six serial two-fan pairs. Accordingly, during operation, the airflow of a fan pair passes through both fans and both fans are in operation. For example, fans 440A and 440G may form fan pair A and fan 440B and 440H may form fan pair B, and so on.

Fan controller 450A is configured to primarily control fans 440A–F and fan controller 450B is configured to primarily control fans 440G–L. In addition, each of fan controllers 450A and 450B may monitor the operation of fans 440G–L. In one embodiment, each of fans 440A–L may be configured to provide a fan fail signal indicative of the fan's operational state. For example, the fan fail signal may be a logic level signal such as a logic one or a high level to indicate that the fan is operational, while a logic zero or low level may indicate that the fan is not operational. Although it is contemplated that in other embodiments, the logic levels may be reversed to indicate a fan failure. Further, each of fans 440A–L may be configured to provide a fan speed signal corresponding to the fan's speed. For example, in one embodiment, the speed signal may be indicative of the fan's revolutions per minute (RPM). In another embodiment, the speed signal may be a digital output and include several digitally encoded bits which correspond to the fan's speed. Accordingly, fan cooling system 400 may provide a redundant cooling system with no single point of failure.

In one embodiment, a failing fan may be a fan with a fan fail signal indicating a failure or a failing fan may be a fan that did not reach a setpoint speed. Accordingly, each of fan controllers 450A–B may cause a given fan to operate at a particular speed (e.g., low, high and super-high speed) and may also detect whether the given fan actually attained the setpoint speed by detecting a difference between the setpoint speed and actual speed.

In one embodiment, fan controller 450A and fan controller 450B may each include fail-over logic 453A and 453B, respectively. Fan controller 450A and fan controller 450B may each also include an integrated circuit (not shown) such as a microcontroller, for example, which may serve as an interface to a system controller (not shown), for control and diagnostic functions. In another embodiment, fan controller 450A and fan controller 450B may each include other control logic (not shown) including status and control registers which may be used to control and monitor fans 440G–L. In addition, in one embodiment, each of fan controllers 450A–B may include a power converter unit (not shown) which may be configured to receive power from the computer system power supplies and to provide power to the fan controller board components.

In one embodiment, each of fans 440A–L may be configured to operate at three speeds: low speed, high speed, and super high-speed. It is contemplated that in other embodiments, the fans may include other numbers of fan speeds. During operation, fan cooling system 400 may be configured to have both sets of six fans (i.e., all twelve fans) running at high speed to provide cooling air. This may be in contrast to a fan cooling system which may have backup fans that are powered off and may be free-wheeling. In one embodiment, a system controller (not shown) of computer system 10 may monitor all system functions, including the operational state of fan cooling system 400.

In one embodiment, the system controller (not shown) may communicate with the one fan controller which it considers as the master via the appropriate communication link 451A or 451B. Thus, one fan controller is assumed to be the master fan controller and the second fan controller is a slave.

The operation of fan cooling system 400 may be illustrated by way of an example. Assume that fan controller 450A is the master. As described above, fans 440G–L are all operating at high speed to provide cooling air. Fan controller 450A is actively controlling fans 440A–F and fan controller 450B is actively controlling fans 440G–L. In addition, fan controller 450A is monitoring the operation of fans 440A–L. In one embodiment, fan controller 450A may monitor the fan speed and the fan fail signals of each of fans 440A–L and may store information corresponding to the fan operation within status registers. Similarly, fan controller 450B may monitor the fan speed and the fan fail signals of each of fans 440A–L and may store information corresponding to the fan operation within status registers.

Assume, for example, that fan 440E fails. Fan controller 450A and fan controller 450B may both detect the failure. In response to detecting the failure, fan controller 450B may cause the second fan (e.g., fan 440K) of fan pair E to switch to super high-speed and fan controller 450A may power down fan 440E. In addition, in one embodiment, fan controller 450A may notify the system controller (not shown) of the failure. In an alternative embodiment, system software may cause the system controller to poll the status registers of the master fan controller (e.g., fan controller 450A) to detect failures. Further, in one embodiment, the system controller may notify maintenance personnel of the failure.

Each of fan controllers 450A and 450B may be interconnected and configured to detect a failure of the other fan controller. If a fan controller fails, the remaining fan controller may detect the failure and increase the speed of the fans it controls to super high-speed while the fans controlled by the failing fan controller may be powered down. For example, a power converter (not shown) on a given fan controller may fail causing the entire fan controller to malfunction. In one embodiment, each of fan controllers 450A and 450B may monitor the power converter voltage of the other fan controller. Thus, if the master fan controller (e.g., fan controller 450A) power converter fails, it may be detected by the slave fan controller (e.g., fan controller 450A) and in response to detecting the failure, the slave controller may increase the speed of all the fans it controls to super high-speed. If the slave fan controller power converter fails, the master fan controller may detect the failure and increase the speed of all the fans it controls to super high-speed. In another embodiment, a fan controller failure may be detected by the other fan controller since each fan fail signal of the failing controller may indicate a failure. In still another embodiment, each of fan controllers 450A and 450B may provide a heartbeat signal which may be monitored by each fan controller and by the system controller. The heartbeat signal may be indicative of the operational status of each fan controller.

As described above, if the master fan controller fails, the slave controller may increase the speed of all the fans it controls to super high-speed. In addition, fail-over logic 453A–B may automatically enable the slave fan controller to become the master controller. Further, in one embodiment, in response to detecting the failure, the system controller may isolate the failed master fan controller and begin communicating with the slave fan controller, which is now the master fan controller. Alternatively, if the slave fan controller fails first, the master fan controller may detect the failure as described above and may also notify the system controller of the failure as described above.

In addition to increasing fan speed in response to a fan failure, fan controller 450A and 450B may also increase fan speed in response to commands received from the system controller. For example, the system controller may monitor the temperature within system cabinet 30 of FIG. 1 and FIG. 2 and may detect when the temperature rises beyond an acceptable limit. In response to a rise in temperature, the system controller may cause fan controllers 450A and 450B to increase the speed of fans 440A–L to high speed until the temperature is within an acceptable range.

As noted above, fan controllers 450A–B may include a microcontroller (not shown) which may be used to facilitate diagnostic functions. In one embodiment, the system controller may test the functionality of fan controllers 450A–B by sending fan control commands to each of fan controllers 450A–B and then monitoring whether the fan controllers responded correctly. For example, the system controller may send a command to fan controller 450A to set fans 440A–F to low, high and super high-speed. After each speed setting, the system controller may poll fan controller 450A to ensure that each fan was actually able to attain the correct speed. Further, the system controller may write a value to the microcontroller of fan controller 450A which may force a fan fail signal to indicate a fan fail condition. The system controller may then monitor the response of fan controller 450B to ensure that the corresponding fan of the fan pair including the failed fan has been set to super high-speed. Similarly, the system controller may perform diagnostic functions on fan controller 450B to check operation of fans 440G–L.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A cooling system comprising:
    a first fan controller coupled to control a first plurality of fans;
    a second fan controller coupled to control a second plurality of fans;
    wherein during operation, said first plurality of fans and said second plurality of fans operate concurrently;
    wherein said first fan controller and said second fan controller are each configured to monitor said first and said second plurality of fans and to detect a failure in any of said first and said second plurality of fans;
    wherein in response to detecting a failure of a fan of said first plurality of fans, said second fan controller is configured to increase an operating speed of a corresponding fan of said second plurality of fans.

2. The cooling system as recited in claim 1, wherein in response to detecting a failure of a fan of said first plurality of fans, said first fan controller is further configured to power down said failing fan of said first plurality of fans.

3. The cooling system as recited in claim 1, wherein in response to detecting a failure of a fan of said second plurality of fans, said first fan controller is configured to increase an operating speed of a corresponding fan of said first plurality of fans.

4. The cooling system as recited in claim 1, wherein in response to detecting a failure of a fan of said second plurality of fans, said second fan controller is further configured to power down said failing fan of said second plurality of fans.

5. The cooling system as recited in claim 1, wherein said each of said first plurality of fans is positioned in a stacked arrangement with a corresponding fan of said second plurality of fans forming a plurality of stacked fan pairs, wherein airflow from a given one of said first plurality of fans is forced through a corresponding one of said second plurality of fans.

6. The cooling system as recited in claim 1, wherein said first and said second fan controllers are configured to monitor an operating speed of each of said first and said second plurality of fans, respectively.

7. The cooling system as recited in claim 1, wherein said first fan controller and said second fan controller are each configured to monitor a fan fail signal provided by each of said first and said second plurality of fans, wherein said fan fail signal is indicative of whether a respective fan is operational.

8. The cooling system as recited in claim 1, wherein said first and said second fan controllers are configured to detect a difference between an operating speed set point and an actual operating speed of each of said first and said second plurality of fans.

9. The cooling system as recited in claim 1, wherein said first fan controller includes a first fail-over logic configured to detect a failure in said second fan controller.

10. The cooling system as recited in claim 9, wherein said first fail-over logic is further configured to cause said first fan controller to increase said operating speed of all of said first plurality of fans in response to detecting said failure in said second fan controller.

11. The cooling system as recited in claim 1, wherein said second fan controller includes a second fail-over logic configured to detect a failure in said first fan controller.

12. The cooling system as recited in claim 11, wherein said second fail-over logic is further configured to cause said second fan controller to increase said operating speed of all of said second plurality of fans in response to detecting said failure in said first fan controller.

13. The cooling system as recited in claim 1, wherein in response to a detecting a failure of any given fan, said first fan controller and said second fan controller are each configured to report said failure to a system controller.

14. The cooling system as recited in claim 13, wherein in response to commands from said system controller said first fan controller and said second fan controller are each configured to perform diagnostic functions including:
  changing an operating speed setpoint of each fan of said first and second pluralities of fans, respectively and detecting whether each fan an of said first and second pluralities of fans operates at said operating speed setpoint;
  powering off each fan of said first and second pluralities of fans, respectively and detecting whether a fan fail signal provided by each fan of said first and second pluralities of fan indicates a respective fan failure;
  detecting whether each corresponding fan of a fan pair increases its speed in response to each fan of said first and second pluralities of fans being powered off; and
  reporting detected failures during said diagnostic functions to said system controller.

15. The cooling system as recited in claim 1, wherein said first plurality of fans and said second plurality of fans are mounted in a fan tray.

16. The cooling system as recited in claim 15, wherein said fan tray is hot-swappable.

17. A computer system comprising:
  a plurality of system boards;
  a cooling system for cooling said system boards, wherein said cooling system includes:
    a first fan controller coupled to control a first plurality of fans;
    a second fan controller coupled to control a second plurality of fans;
    wherein during operation, said first plurality of fans and said second plurality of fans operate concurrently;
    wherein said first fan controller and said second fan controller are each configured to monitor said first and said second plurality of fans and to detect a failure in any of said first and said second plurality of fans;
    wherein in response to detecting a failure of a fan of said first plurality of fans, said second fan controller is configured to increase an operating speed of a corresponding fan of said second plurality of fans.

18. The computer system as recited in claim 17, wherein said system boards include a system controller which is coupled to said first and said second fan controllers and configured to monitor operation of said first and said second fan controllers.

19. The computer system as recited in claim 17, wherein in response to detecting a failure of a fan of said first plurality of fans, said first fan controller is further configured to power down said failing fan of said first plurality of fans.

20. The computer system as recited in claim 17, wherein in response to detecting a failure of a fan of said second plurality of fans, said first fan controller is configured to increase an operating speed of a corresponding fan of said first plurality of fans.

21. The computer system as recited in claim 17, wherein in response to detecting a failure of a fan of said second plurality of fans, said second fan controller is further configured to power down said failing fan of said second plurality of fans.

22. The computer system as recited in claim 17, wherein said each of said first plurality of fans is positioned in a stacked arrangement with a corresponding fan of said second plurality of fans forming a plurality of stacked fan pairs, wherein airflow from a given one of said first plurality of fans is forced through a corresponding one of said second plurality of fans.

23. A method for cooling system boards of a computer system, said method comprising:
  providing a first fan controller coupled to control a first plurality of fans;
  providing a second fan controller coupled to control a second plurality of fans;
  operating said first plurality of fans concurrently with said second plurality of fans during operation;
  monitoring said first and said second plurality of fans and detecting a failure in any of said first and said second plurality of fans; and
  increasing an operating speed of a corresponding fan of said second plurality of fans, in response to detecting a failure of a fan of said first plurality of fans.

24. The method as recited in claim 23 further comprising powering down said failing fan of said first plurality of fans in response to detecting a failure of a fan of said first plurality of fans.

25. The method as recited in claim 23 further comprising increasing an operating speed of a corresponding fan of said first plurality of fans in response to detecting a failure of a fan of said second plurality of fans.

26. The method as recited in claim 23 further comprising powering down said failing fan of said second plurality of fans in response to detecting a failure of a fan of said second plurality of fans.

27. The method as recited in claim 23 further comprising stacking each of said first plurality of fans onto a corresponding fan of said second plurality of fans to form a plurality of stacked fan pairs, wherein airflow from a given one of said first plurality of fans is forced through a corresponding one of said second plurality of fans.

* * * * *